(12) United States Patent
Kälvesten et al.

(10) Patent No.: US 7,560,802 B2
(45) Date of Patent: Jul. 14, 2009

(54) ELECTRICAL CONNECTIONS IN SUBSTRATES

(75) Inventors: Edvard Kälvesten, Hägersten (SE); Thorbjörn Ebefors, Huddinge (SE); Niklas Svedin, Stockholm (SE); Pelle Rangsten, Storvreta (SE); Tommy Schönberg, Tyresö (SE)

(73) Assignee: Silex Microsystems AG, Jarfalla (SE)

( * ) Notice: Subject to any disclaimer, the term of this patent is extended or adjusted under 35 U.S.C. 154(b) by 393 days.

(21) Appl. No.: 10/550,199

(22) PCT Filed: Mar. 22, 2004

(86) PCT No.: PCT/SE2004/000439

§ 371 (c)(1),
(2), (4) Date: Jul. 11, 2006

(87) PCT Pub. No.: WO2004/084300

PCT Pub. Date: Sep. 30, 2004

(65) Prior Publication Data
US 2007/0020926 A1  Jan. 25, 2007

(30) Foreign Application Priority Data
Mar. 21, 2003  (SE) ................................. 0300784

(51) Int. Cl.
*H01L 29/40* (2006.01)
*H01L 23/52* (2006.01)
*H01L 23/48* (2006.01)
*H01L 23/488* (2006.01)
*H01L 23/485* (2006.01)

(52) U.S. Cl. ..................... 257/621; 257/773; 257/774; 257/778; 257/779; 257/780; 257/E23.023; 257/E23.021

(58) Field of Classification Search ................. 257/621, 257/773, 774, 778, 779, 780, E23.023, E23.021
See application file for complete search history.

(56) References Cited

U.S. PATENT DOCUMENTS

| | | |
|---|---|---|
| 6,002,177 A | 12/1999 | Gaynes et al. |
| 6,353,262 B1 | 3/2002 | Honda |
| 6,475,821 B2 | 11/2002 | Honda |
| 6,756,304 B1 | 6/2004 | Robert |
| 6,815,827 B2 * | 11/2004 | Vieux-Rochaz et al. ..... 257/775 |
| 6,825,967 B1 | 11/2004 | Chong et al. |
| 6,838,362 B2 | 1/2005 | Mastromatteo et al. |
| 7,227,213 B2 | 6/2007 | Mastromatteo et al. |
| 2003/0022475 A1 | 1/2003 | Vieux-Rochaz et al. |

FOREIGN PATENT DOCUMENTS

| | | |
|---|---|---|
| EP | 0926726 A1 | 6/1999 |
| EP | 1 351 288 | 10/2003 |

* cited by examiner

*Primary Examiner*—Luan C Thai
(74) *Attorney, Agent, or Firm*—Young & Thompson

(57) ABSTRACT

A method of making an electrical connection between a first (top) and a second (bottom) surface of a conducting or semi-conducting substrate includes creating a trench in the first surface, and establishing an insulating enclosure entirely separating a portion of the substrate, defined by the trench. Also described is a product usable as a starting substrate for the manufacture of micro-electronic and/or micro-mechanic devices, including a flat substrate of a semi-conducting or conducting material, and having a first and a second surface and at least one electrically conducting member extending through the substrate. The electrically conducting member is insulated from surrounding material of the flat substrate by a finite layer of an insulating material, and includes the same material as the substrate, i.e. it is made from the wafer material.

20 Claims, 15 Drawing Sheets

ELECTRICAL CONNECTIONS IN SUBSTRATES

FIELD OF THE INVENTION

The present invention relates generally to the field of semi-conductor technology, and in particular to a method of making a product, usable as a starting substrate for the manufacture of a large variety of semi-conductor devices. It also relates to the product as such.

BACKGROUND OF THE INVENTION

In many applications in the semi-conductor industry (in a broad sense including both micro-electronics, micro-optics and micro-mechanics) it is often required to build components on both sides of a semiconductor wafer, such as a silicon wafer, for the manufacture of semi-conductor devices, such as sensors, micro-mirror arrays, just to mention a few.

In the prior art for packaging and interconnecting such devices wire-bonding has been the common technique. However, wire bonding is not cost-effective and for devices requiring many interconnection wires, such as array devices, it may not possible to attach wires at all. Therefore, over the last decade so called flip-chip mounting has been widely used for electronic components, to avoid the need of wire bonding, thereby allowing for simplification, improved quality and cost reduction in the back-end packaging/interconnection process. However, flip-chip bonding connects the device with "front-side" down. This is most often not possible for MEMS devices (MEMS=Micro-Electrical-Mechanical Systems), for example sensors and micro-mirrors, which need to have the front-side up.

Other techniques in this field have been based on the provision of metallized portions in holes extending through a wafer, for the purpose of establishing electrical contact between the two surfaces.

Such mixing of materials (i.e. metals and semiconductor material of the wafers) puts limitations on the subsequent processes that can be utilized for the manufacture of components, in terms of usable temperatures and chemical environments.

One method of the just mentioned kind is disclosed in U.S. Pat. No. 6,002,177.

A further method is disclosed in WIPO publication WO 01/65598 A1 (corresponding to published US patent application 2003/0022475 A1), by Vieux-Rochaz et al.

The method in the latter document comprises the provision of grooves on one side of a wafer, the grooves defining suitable closed patterns, e.g. rings, squares rectangles etc., filling the grooves with insulating material, building components matching the enclosed areas, making a plurality of second grooves from the bottom surface mating with the top grooves, filling said second grooves with insulating material, and building components on the bottom surface, using the thus formed electrical connections to connect the top and bottom components as desired.

This process is fairly complex, and the publication does not disclose the manufacture of a platform comprising electrical through connections (vias), and usable as a generally applicable starting substrate for semi-conductor applications.

SUMMARY OF THE INVENTION

Therefore, the object of the present invention is to provide a method of making a generally applicable starting substrate for semi-conductor manufacture applications, allowing full utilization of common process technology in this field, without any restrictions in process parameters.

Thereby, there is provided a method of making an electrical connection between a first (top) and a second (bottom) surface of a conducting or semi-conducting substrate, comprising creating a trench in the first surface; establishing an insulating enclosure entirely separating a portion of said substrate, defined by said trench, from surrounding material of said substrate, but exposing the top and bottom surfaces of said separated portion.

In a further aspect of the invention there is provided a platform product for semi-conductor manufacture applications, comprising a wafer of a conducting or a semi-conducting material, and having well defined electrical through connections (vias).

The present invention with wafer through electrical interconnection vias allows "flip-chip packaging" without flipping the front-side downwards since the solder bumps for flip-chip mounting could be placed on the backside of the (MEMS) device.

BRIEF DESCRIPTION OF THE DRAWINGS

The invention will be described below with reference to the drawings, in which

FIG. 5b shows the result of the method according to FIG. 5a.

DETAILED DESCRIPTION OF PREFERRED EMBODIMENTS OF THE INVENTION

Figure 1:
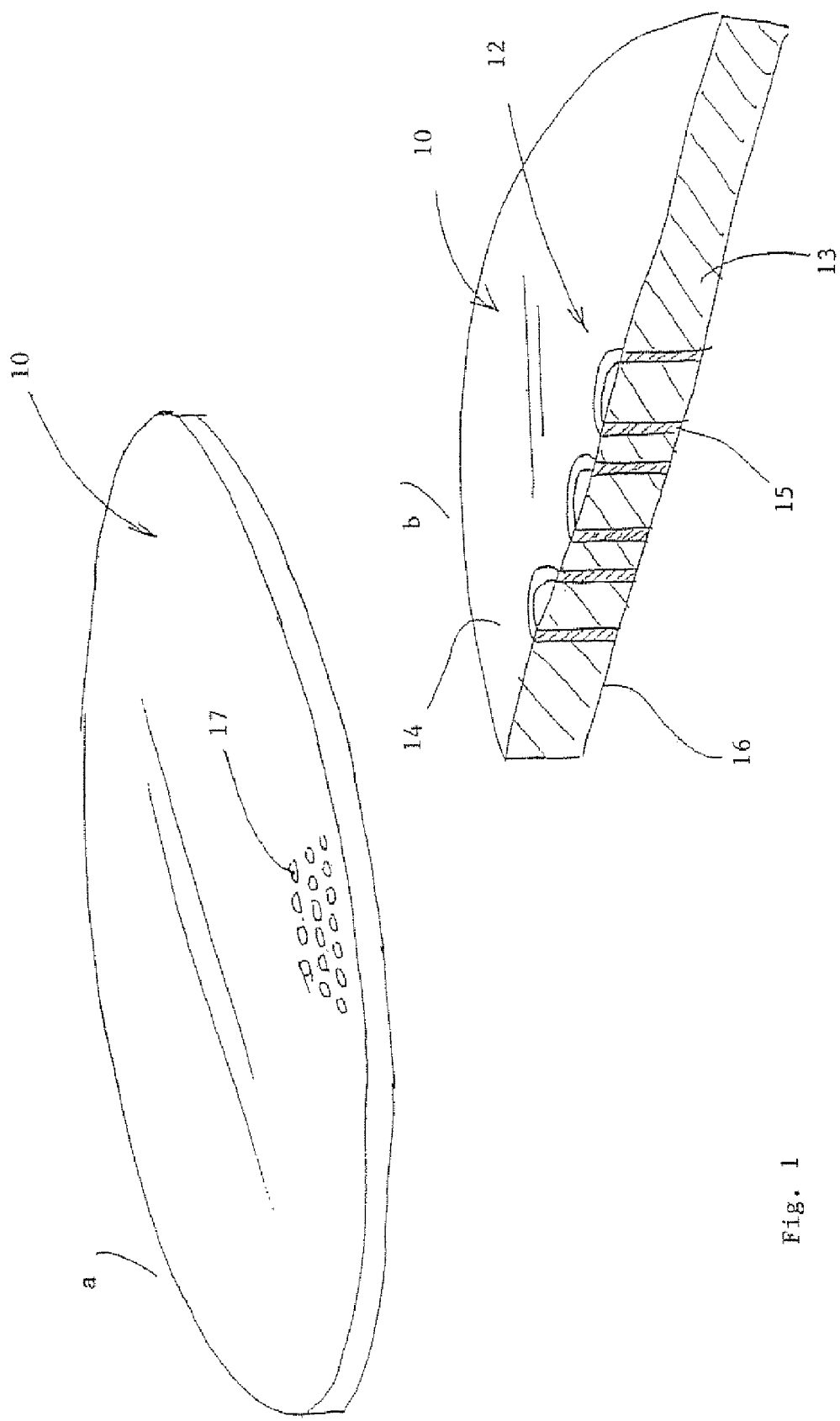
FIG. 1a is a schematic perspective view of a wafer having vias of the invention.
FIG. 1b is a schematic cross section of a wafer as in FIG. 1.

The invention in its broadest aspect is schematically illustrated in FIGS. 1a and b (not to scale). It comprises a wafer 10 of a conducting or a semi-conducting material, forming a substrate suitable for the manufacture of a large variety of micro-electronic devices, an/or micro-mechanic devices, and/or micro-optical devices, requiring components on both sides of the wafer, e.g. sensors, micro-mirror arrays, micro-optical components such as lasers etc.

The inventive feature is the provision of vias 12, or electrical through connections, extending from a top side 14 of the wafer 10 to a bottom side 16. By means of the method according to the invention the vias comprise the same material as the material of the wafer, i.e. they are made from the wafer itself. Thus, no auxiliary material is used for the actual electrical connection.

In order to separate the vias 12 from the bulk 13 of the wafer in an electrically insulating manner, there is according to the invention oxide material 15 introduced between the bulk 13 and the vias 12. The method will be described in further detail below.

By virtue of the fact that only "wafer native" material is used, i.e. the material of the wafer itself is used to manufacture the vias, the wafer having been provided with said vias in a desired structure, can be subjected to all the processing steps employed in the semi-conductor field, in terms of temperature, chemical environment, pressure etc, that a "native wafer" can be subjected to. Prior art devices (i.e. starting wafers for semiconductor electronics manufacture) comprising metallized portions, cannot be processed in the same versatile way, because the metallization will not withstand too high temperatures, or the chemical agents frequently used in etching and other procedures needed to make the desired electronic or micro-mechanic structures.

Another advantage is that the wafer according to the invention is flat exhibiting a very low surface roughness, down to mirror appearance.

By "native wafer" and "native wafer material" we mean the material in the original wafer itself. "Auxiliary material" would therefore be any other material that has been added to the structure, such as a metal pad for connection purposes.

A "wafer" shall be taken to mean a general substrate usable as a starting material for e.g. MEMS applications. It is not necessarily completely flat, but can be provided with pre-defined structures such as depressions or other elements or members created by some process performed on the material from which the wafer is made.

Figure 2A:
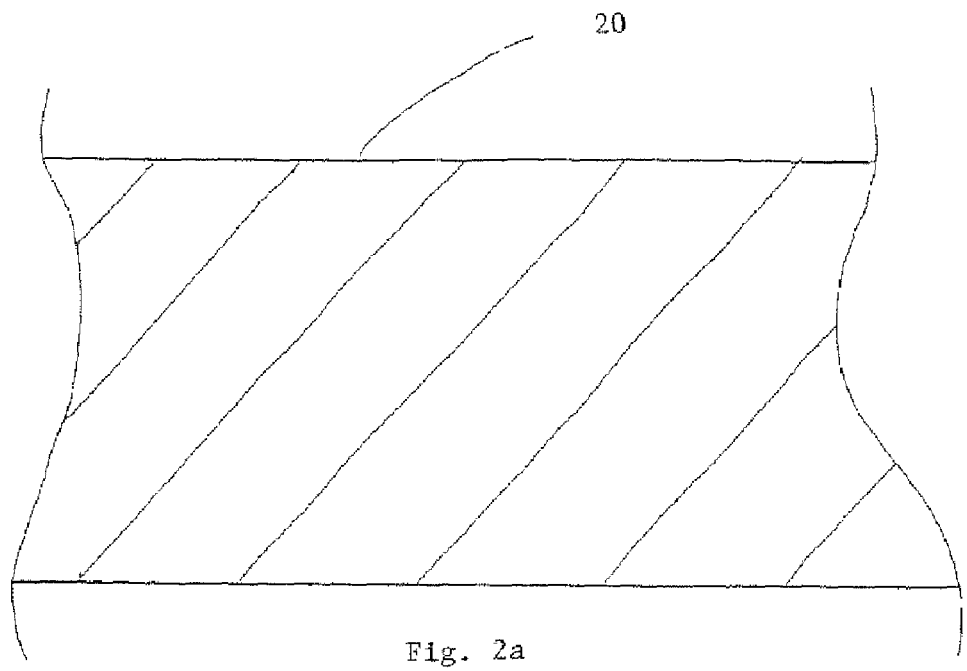
FIG. 2a shows a cross section of a wafer before processing.
Figure 2B:
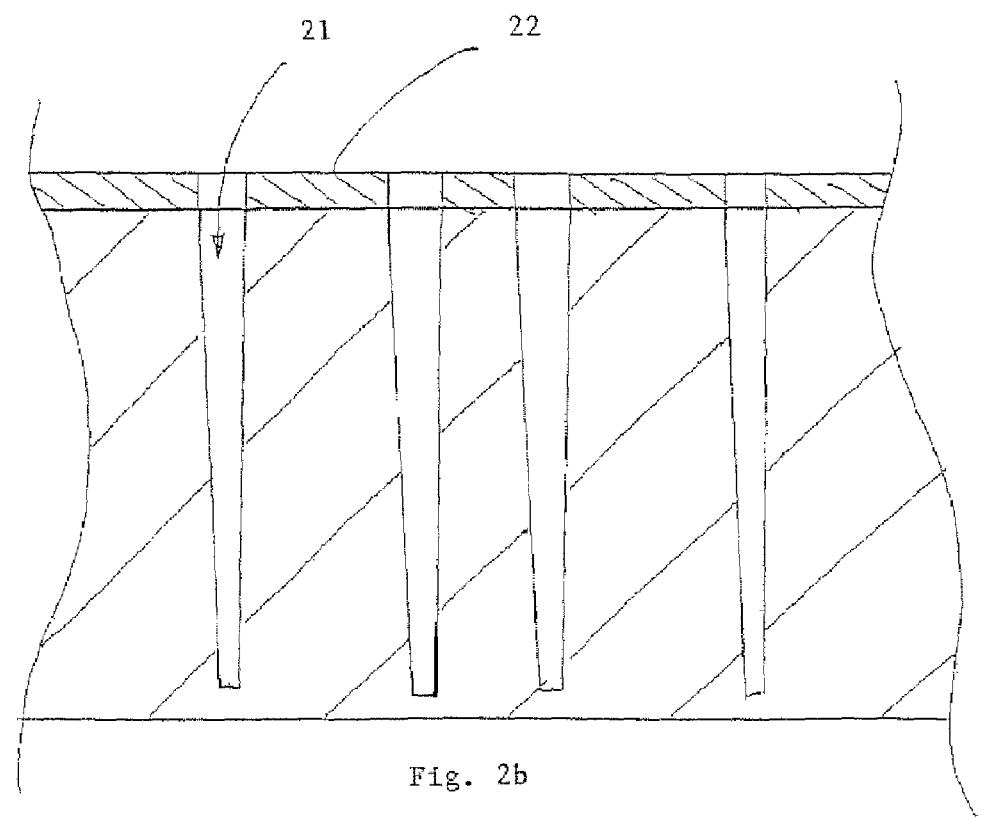
FIG. 2b illustrates a wafer with trenches in cross section.
Figure 2C:
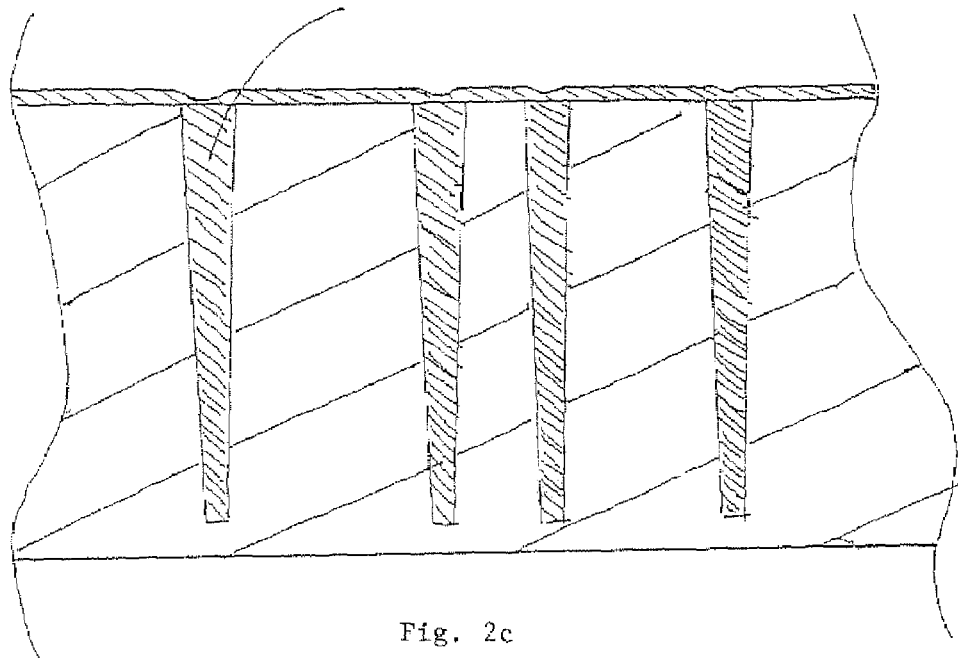
FIG. 2c shows a wafer with trenches filled with oxide.

In a first embodiment of the invention, illustrated in FIG. 2a-2c (cross sections of a wafer during the different process steps; not to scale), the vias are made in a process characterized as comprising two general steps, namely provision of trenches and introducing insulating material into the grooves, and optionally filling the trenches, at least partially with oxide.

The starting material is a conducting or a semiconductor wafer 20 (FIG. 2a), suitably a silicon wafer (although there are no specific limitations on the materials used), having a thickness of 500 μm, although the thickness can vary between 300 μm and 1000 μm. Most commercially available silicon (or other semi-conductor) wafers are about 300-1000 μm thick, depending on size and intended application. However, the invention is applicable to wafers exhibiting a thicknes of 200-5000 μm, preferably 300-3000 μm, most preferably 400-1000 μm.

The first general step is the provision of a trench 21, i.e. a narrow recess encircling a portion of the wafer top surface. The trench is made for example by etching or by laser based machining, or by EDM (electro-discharge machining).

Trench definition is achieved by providing a lithographic mask 22 (FIG. 2b) on the wafer, which in itself does not form part of the invention. It is considered to pertain to the field of the skilled man to design and use suitable masking and etching techniques, given the materials used. Thus, a detailed discussion of the provision of the mask is not given herein.

Preferably trenches are made by any etching method yielding a high aspect ratio, e.g. DRIE (Dry Reactive Ion Etching), electrochemical HF etch.

The trench should be less than 20 μm, preferably 4-15, most suitably about 6-12 wide. Thus, the layers of insulating material are 1-20 μm, typically 6-12 μm thick.

If the wafer is 500 μm thick, the trench is suitably about 200-490 μm, preferably 300-400 μm deep. Suitably the depth of the trench is about 50% up to 100% of the wafer thickness. In the case of 100% penetration, it is necessary that a thin oxide layer be present on the surface, to keep the formed "plug" in place.

With the method according to the invention, the pitch (center-to-center) distance between the electrical connections can be as small as 10 μm, typically 50-100 μm. If there is a thin oxide layer provided on the bottom surface, the etch can be all the way through the wafer until the etch reaches the oxide, which acts as an etch stop. Thereby the via, i.e. the cylindrical plug (in the case of circular etch trench), will be supported by the oxide and prevented from falling out.

Figure 3:
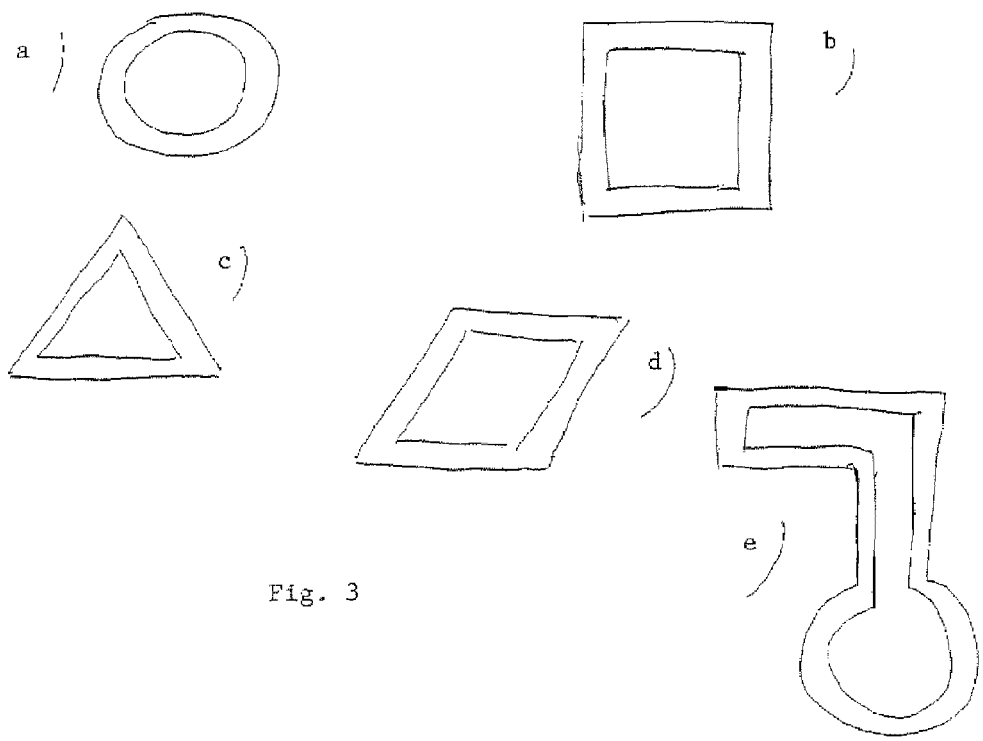
FIG. 3 shows various possible geometrical shapes of trenches.

The shape of the portion encircled by the trench can be circular, but is of course not limited thereto. Any geometric shape that can be achieved is possible, such as squares, rectangles, triangles, romboids, traptezoids etc. or combinations of shapes (FIG. 3). The only limitation regarding the obtainable shapes is set by any inherent limitations of the masking and etching procedures employed.

Once the trench is made, the mask is removed, and the wafer is subjected to an oxidizing process in order to grow insulating oxide 24 in the trench (and on the surfaces of the wafer unless it is protected), FIG. 2c. This is achieved by increasing the temperature to about 800-1300° C., typically 1100° C., in an oxygen containing atmosphere. Optionally, the oxidizing process can be terminated before the trench is completely filled, and the remaining space can be filled with e.g. TEOS 26, in a deposition process, because of its good step coverage properties. However, any insulating material that is compatible with IC or CMOS processing conditions can be used. It is not even strictly necessary to fill the trenches; it will suffice if the material surrounded by the trench is kept at an insulating distance from the wall. This can be achieved by the very small bridging oxide portion at the bottom of the trench.

Figure 2D:
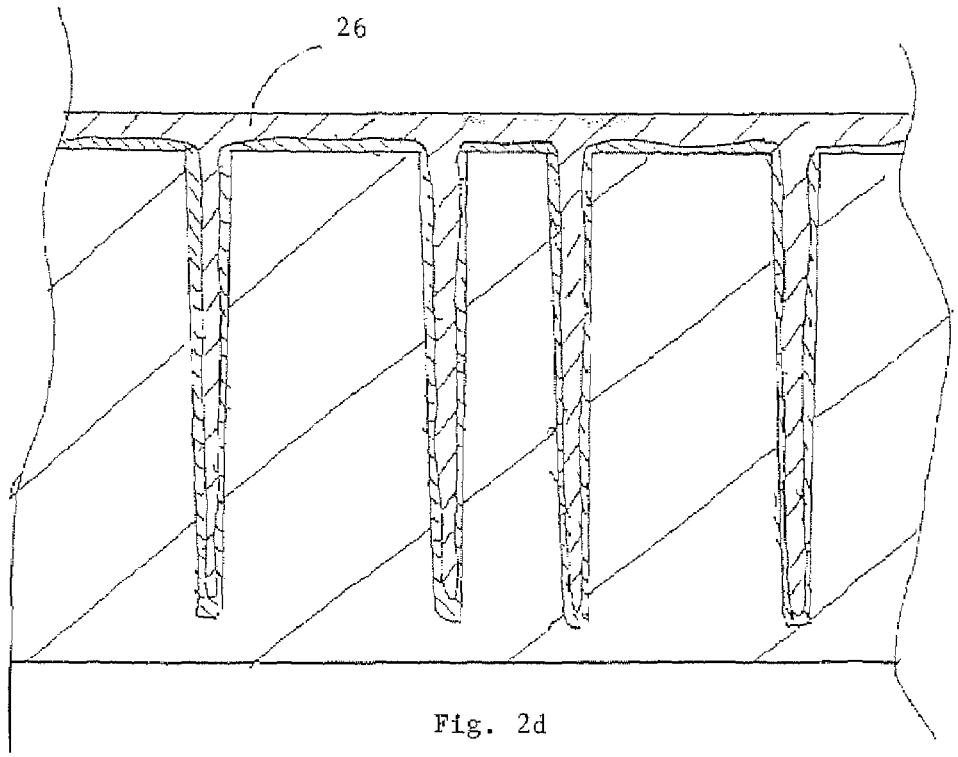
FIG. 2d shows an embodiment where trenches have been filled by oxidation and deposition.
Figure 2E:
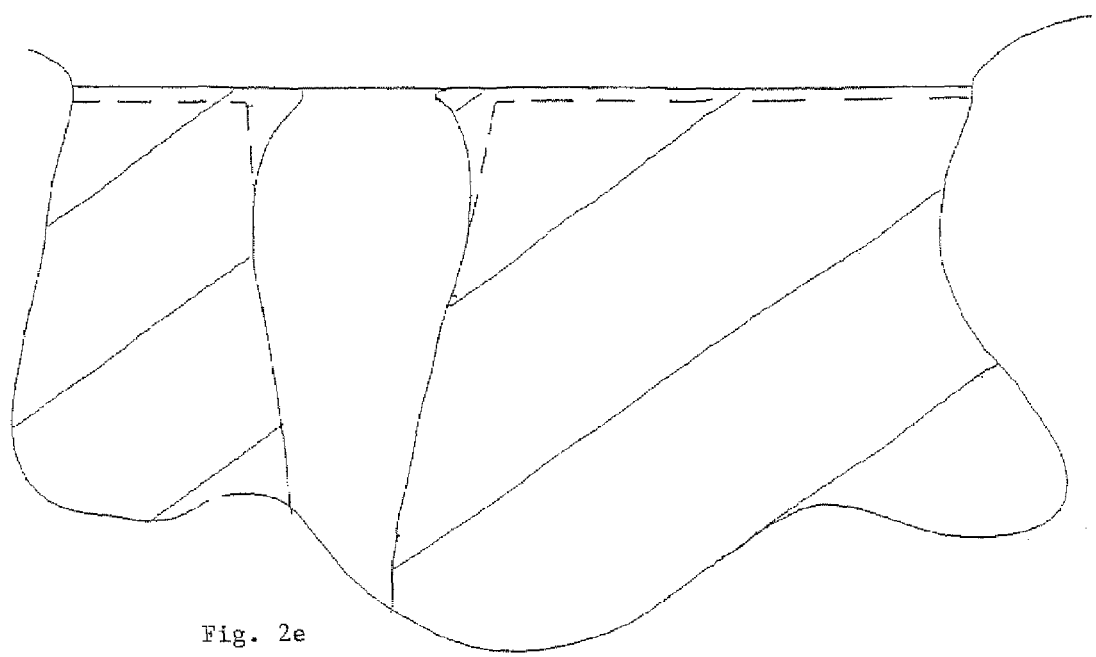
FIG. 2e illustrates a trench exhibiting a narrowed opening.

Frequently, when etching trenches having the high aspect ratio as in the present invention, the opening of the trench at the surface will be slightly narrower than the width about 5-10 μm below the surface (See FIG. 2e). This phenomenon may cause the trench to become incompletely filled with oxide, thereby creating voids (air traps) which may cause problems in the further processing by IC, MEMS or CMOS techniques.

In order to remedy this problem, suitably the wafer is subjected to a further etch after the trench defining mask work on the top surface of the wafer has been removed. This etch will thin down the surface slightly and remove the narrowing edges, leaving only a strictly "funnel" shaped trench cross section. The cross section after the etch is indicate with broken lines in FIG. 2e.

When the trench/trenches have been suitably filled with insulating oxide, to the rate of filling desired, the wafer, in a second step, is subjected to a thinning process. Thereby, the back side of the wafer is thinned down, by grinding or etching or other suitable method, such that the insulating oxide present in the trench/trenches becomes exposed on the back side of the wafer (indicated with a broken line in FIG. 2d). This procedure yields a plurality of "plugs" extending through the wafer and comprising a material which is identical to the bulk material of the wafer. The plugs will be surrounded by insulating oxide in patterns defined by the trenches. The surfaces of these plugs on the top and bottom of the wafer, separated by the insu lating oxide from the surrounding wafer material, represent bonding areas, to which further electronic elements can be bonded by suitable bonding techniques.

For certain applications it is necessary to provide cavities in a wafer, wherein the bottom of the cavity is provided with electrical connections. For such an application it will be sufficient to etch the surface selectively on those areas where said cavities are to be formed. Thus, the overall nominal thickness of the wafer can be maintained, and the etching to expose the insulating material, thereby creating the vias can be achieved only in said depressions.

An example is the provision of deflectable micro-mirrors, where the deflection is carried out electrostatically by applying a voltage to an electrode in a cavity below the deflectable mirror.

An embodiment of the invention for the above purpose will be described with reference to FIGS. 12 and 13 below.

Figure 4A:
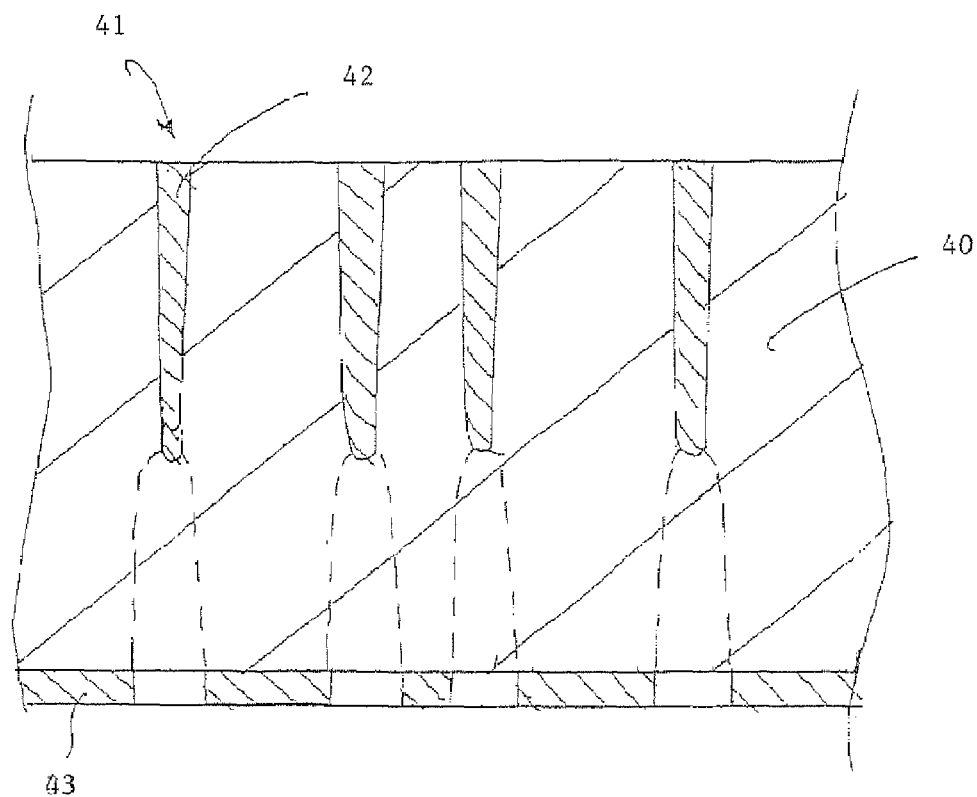
FIG. 4a illustrates a further embodiment of the method according to the invention.
Figure 4B:
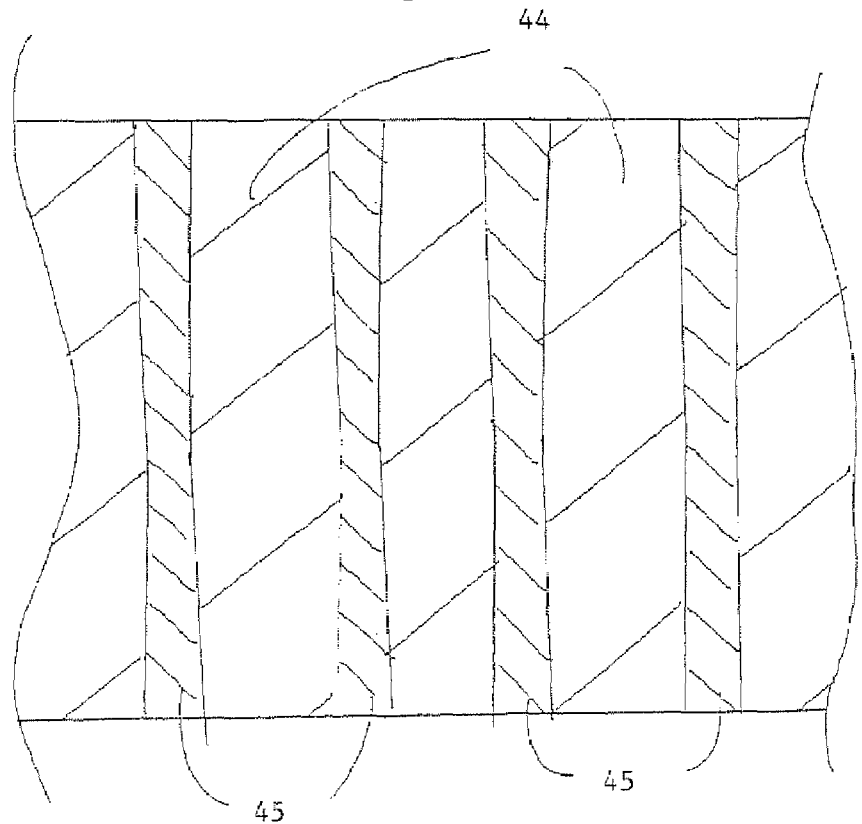
FIG. 4b is a cross section of a wafer having vias made according to the further embodiment of the invention.

In a second embodiment of the invention, illustrated in FIGS. 4a-b, the vias are also made in a process comprising two general steps, the first step of which is identical to the first step of first embodiment, thus yielding trenches 41 filled with insulating material 42, such as oxide and optionally TEOS. Also in this embodiment, it might be sufficient to let the oxide in the bottom of the trench function as a spacer to keep the "plug" free from the surrounding wall.

This embodiment is primarily used when it is desirable to have a thicker platform (wafer substrate) 40 for the further manufacture. Since a trench can be made to exhibit a depth of about 400 μm, it will be possible to make substrates comprising vias, and having a thickness of up to about 800 μm. However, if still thicker wafers, say up to 1000 μm or more are required, the second etch from the bottom side, will generate wider trenches, since a deep trench will inevitably be wider at the opening than a shallow trench. Thus, in this embodiment, the thicker wafers will not be strictly symmetric in the sense that the vias will not exhibit the same appearance on both the top and bottom sides.

In the second step of the second embodiment, patterns 43 are defined by lithographic methods on the bottom surface, see FIG. 4a, said patterns matching the trenches defined on the top surface. This will require an alignment of the patterns. This is however not part of the invention per se, and alignment of patterns are considered to pertain to the field of the skilled man, and will not be further discussed herein.

Trenches are etched in the same way as the trenches on the top side (indicated with a broken line in FIG. 4a), until they meet the oxide in the trenches made in the first step of the procedure. The final structure is shown in FIG. 4b, wherein the vias are designated 44, and the insulating separating walls are designated 45.

In this embodiment a thinning of the wafer is avoided, but at the cost of further processing steps.

Figure 5A:
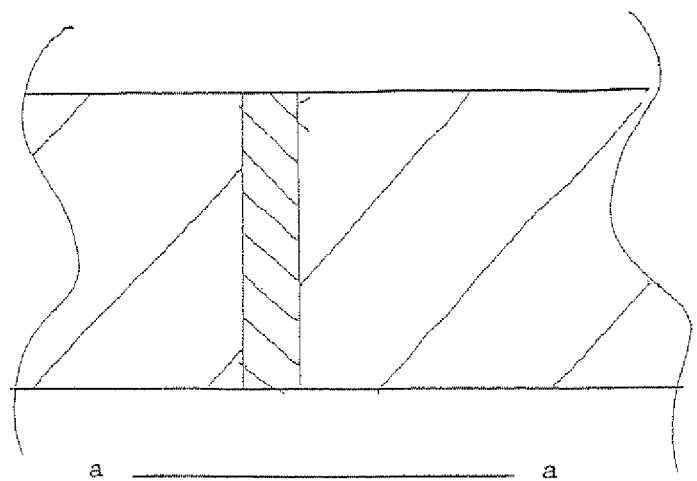
FIG. 5a illustrates another embodiment of the method of making vias according to the invention.
Figure 5A:
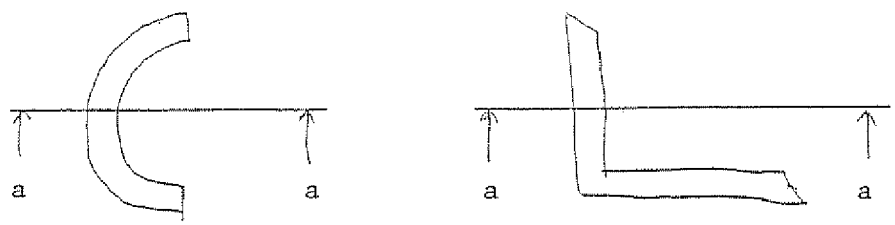
Figure 5B:
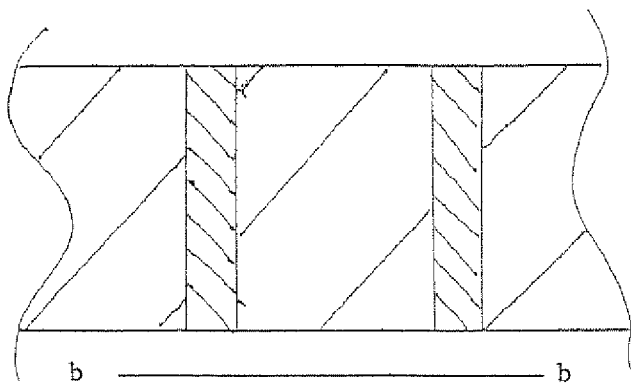
Figure 5B:
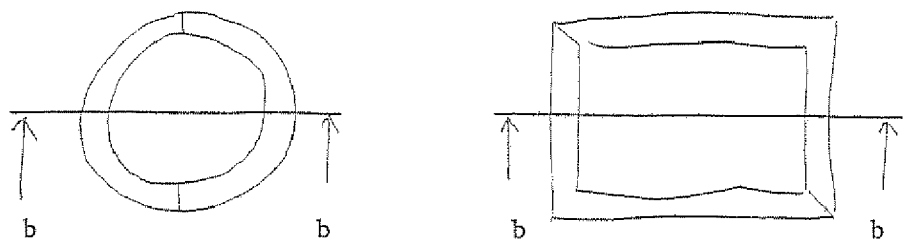

In a third embodiment (FIGS. 5a-b), the first step of the method comprises etching trenches that extend all the way through the wafer. This means that the wafer 50 cannot be thicker than the maximum depth that is achievable by etching, i.e. about 400 μm. However, in this case, in order that the vias will not fall out from the wafer, of course the trench pattern must not define closed structures. That is, each trench is represented by a "line" (see insert in FIG. 5a), having a beginning and an end, such as a semi-circle, or two legs of an angle. When the first trench 52, extending through the wafer has been made, oxide is introduced into the trench, possibly the trench is filled with oxide. Then, a second trench 54, matching the first so as to form a closed structure, i.e. a second semi-circle matching the first semi-circle is etched, and subsequently filled with oxide, if desired.

In principle the final shape can be achieved in several steps, which is still within the inventive concept, but for practical reasons a two-step procedure is the most appropriate.

Figure 6A:
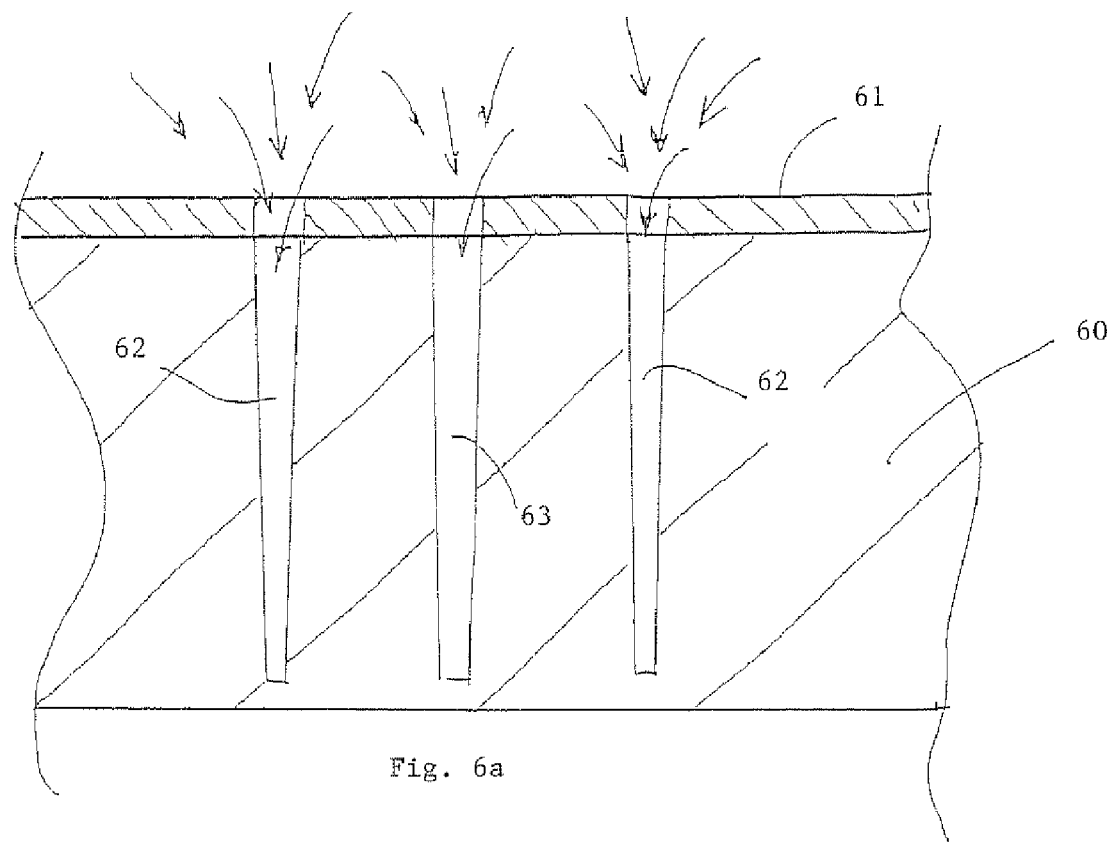
FIG. 6 illustrates doping of a via according to the invention.

A further feature of the invention is to provide selectively doped vias, i.e. the vias exhibit higher conductivity than the bulk of the wafer. This can be achieved by exposing the wafer 60, after trenches have been made, but before the mask work 61 is removed, to a doping process (see FIG. 6a). Doping material is thereby introduced (illustrated by arrows) into the trenches 62 (forming e.g. a circular shape), where it penetrates the walls in the trench, and by diffusion enters the material in the cylindrical plug and also in the wall surrounding the plug to a depth of up to about 15 μm. A suitable exposure and annealing time will yield a fully doped, thus highly conductive via, whereas the bulk of the wafer is non-doped. After (optionally) filling the trenches with insulating material, thermal structure will be a wafer comprising a plurality of high conductivity vias, insulated by means of an oxide from the bulk of the wafer which can be essentially non-conductive, except from a finite region close to the insulating material surrounding the vias. Due to the limited penetration depth, vias up 30 μm in diameter can be made in the above indicated way. However, if a hole 63, having a diameter corresponding to the width of a trench, i.e. 5-10 μm, is provided by etching in the centre of the area surrounded by the trench, the doping can be performed both from the outer circumferential trench and from the center hole. In this way the diameter of the fully doped via can be increased to about 60 μm. In further embodiments it is possible to provide a plurality of concentric trenches, thereby enabling the provision of vias exhibiting a diameter as desired, theoretically exhibiting no limitations regarding size.

Figure 6B:
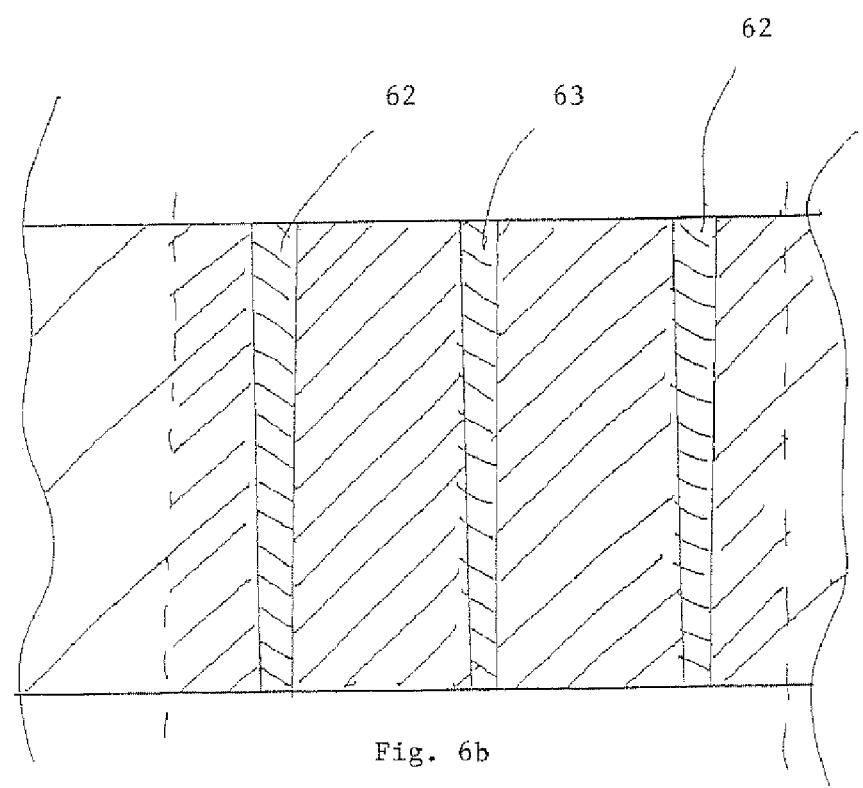

The vias resulting from the doping process is schematically illustrated in FIG. 6b, wherein dope regions are shown with denser hatching (the penetration depth of doping in the bulk of the wafer is shown with broken lines).

This feature will have utility in RF applications.

The invention will now be further illustrated by way of non-limiting examples.

EXAMPLES

Example 1

Prior Art

Figure 7:
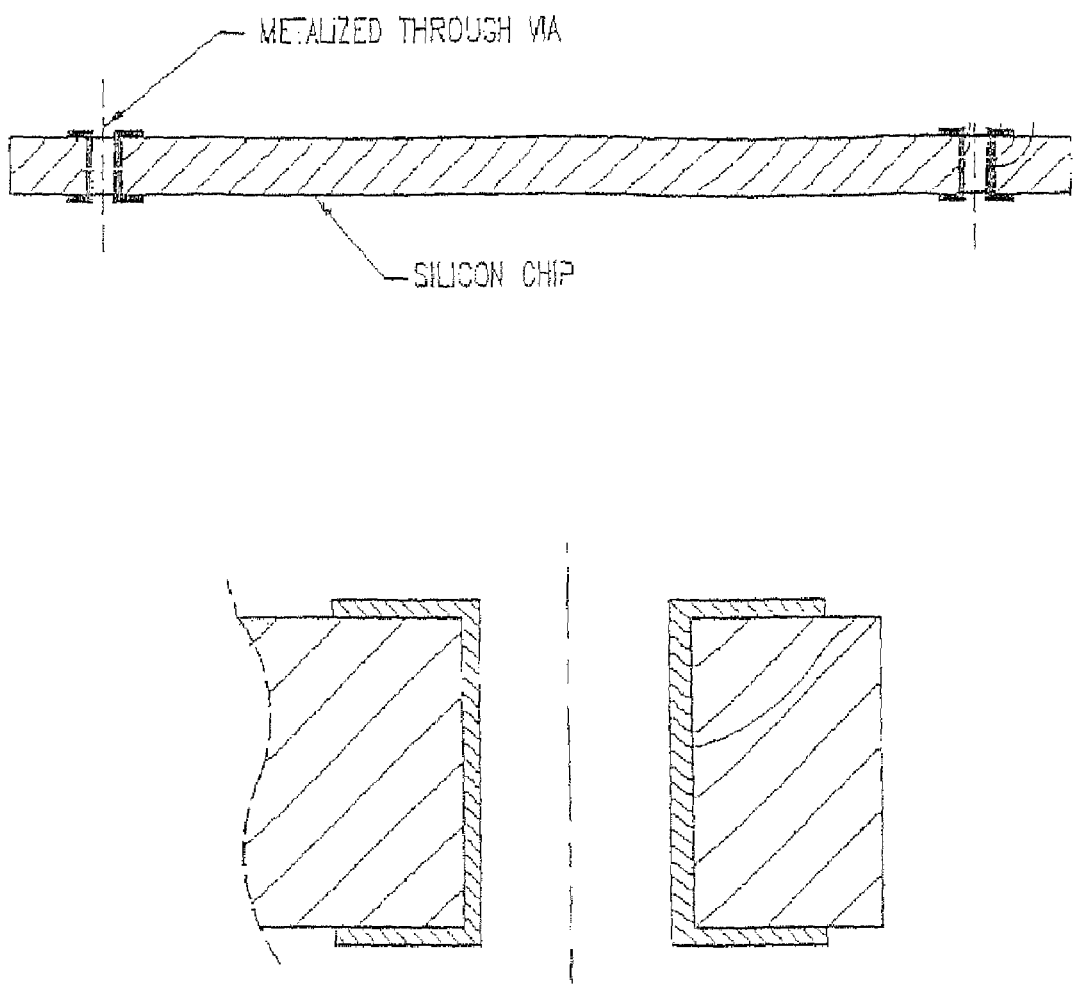
FIG. 7 shows a prior art device.

In FIG. 7 a prior art electrical connection structure is shown (corresponding to FIG. 3 in U.S. Pat. No. 6,002,177). It comprises drilling holes in a silicon chip and metallizing the internal walls of said holes to provide electrical connections between the two sides of the chip.

Example 2

Demonstration of Problem with Standard Trench Etch

A standard trench etch was performed on a silicon wafer. The wafer was 100 mm in diameter and 500 μm thick.

In order to provide the trenches, a patterned mask was provided on one surface (top surface) of the wafer, by standard lithographic technique. The trenches in this example were simple "line" shaped trenches.

The etching process was a so called DRIE (Deep Reactive Ion Etch)

Figure 8:
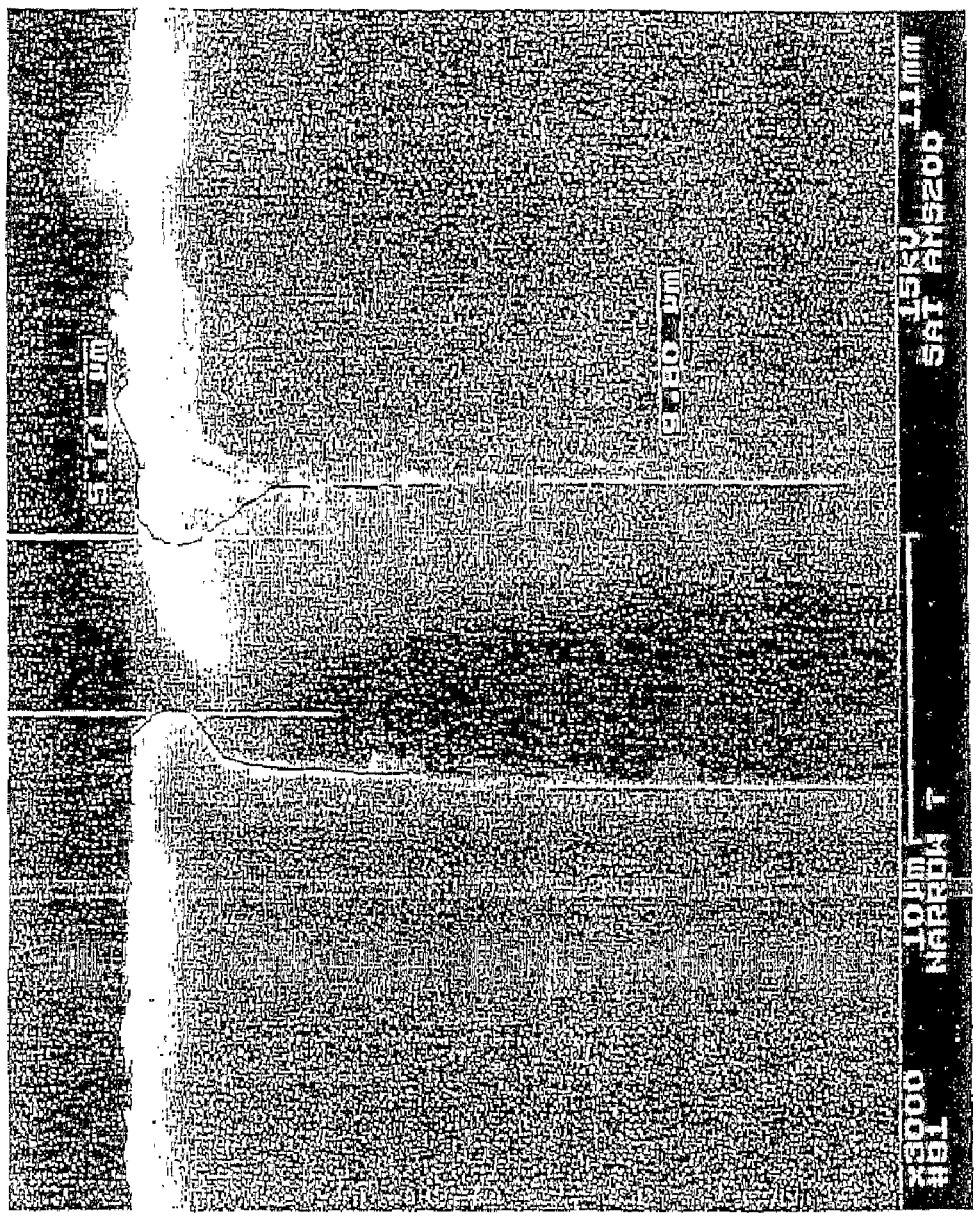
FIG. 8 is a cross section showing an anomaly of an etch.

A series of trenches exhibiting varying depth and width was made the depths varying between 200 and 400 μm and the width between 5 and 12 μm. In FIG. 8 a magnified view of the top opening of a trench is shown. As can be clearly seen, the opening is narrower than the trench about 10 μm down in the trench. This phenomenon causes frequently an incomplete filling of the trench in a subsequent oxide filling step.

Example 3

Elimination of the Standard Etch Drawback

Therefore, in order to remedy this problem, an additional, shallow etch as described in connection with FIG. 2e was performed.

Figure 9A:
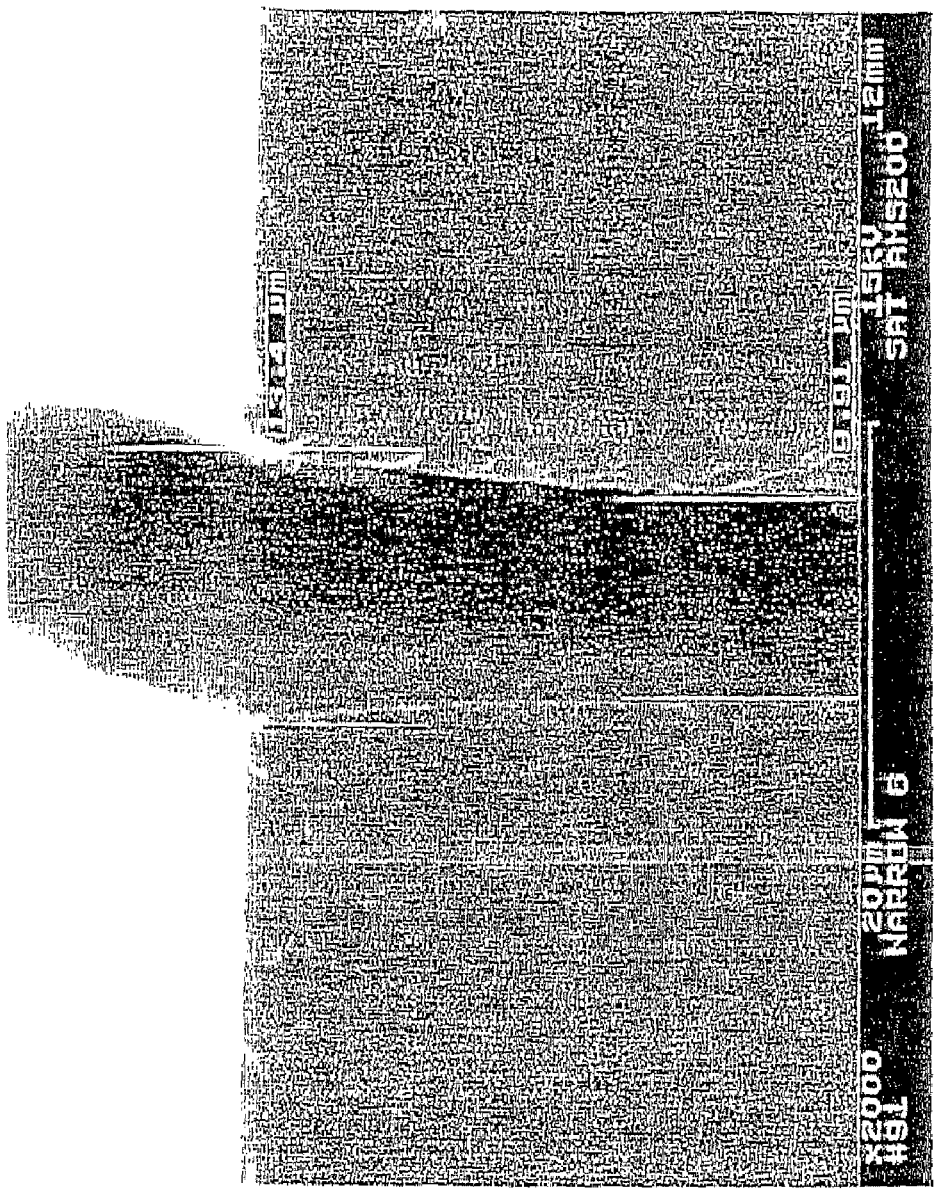
FIG. 9a shows a cross section where the anomaly is remedied.
Figure 9B:
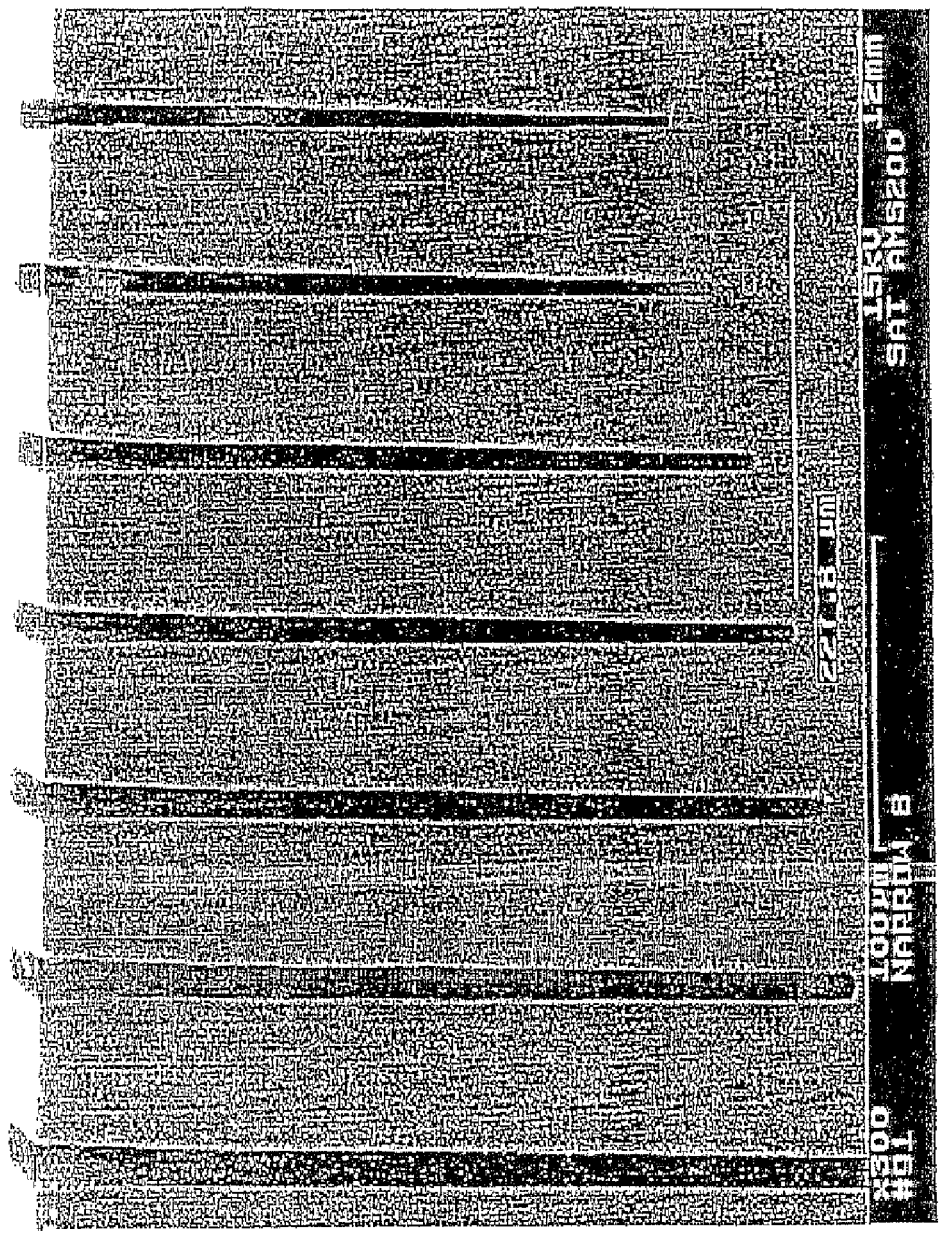
FIG. 9b shows an array of trenches.

This process step yields a strictly monotonic trench shape, as can be seen in FIG. 9a, i.e. the opening is the widest part of the trench, which than gradually becomes narrower. FIG. 9b shows the structure of a plurality of trenches after the shallow etch.

Filling this trench structure with oxide, will result in a completely filled trench with no voids.

Example 4

Figure 10:
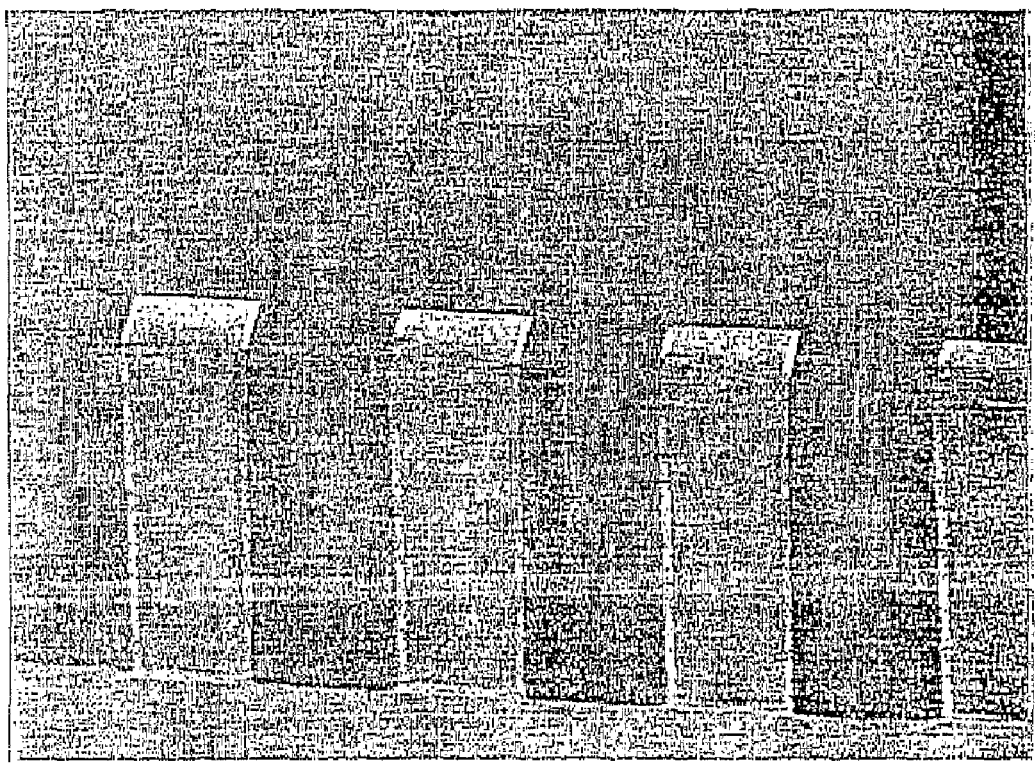
FIG. 10 illustrates a rectangular via according to the invention.

In FIG. 10 an example of an array of completed vias having a rectangular shape is shown.

Example 5

Figure 11:
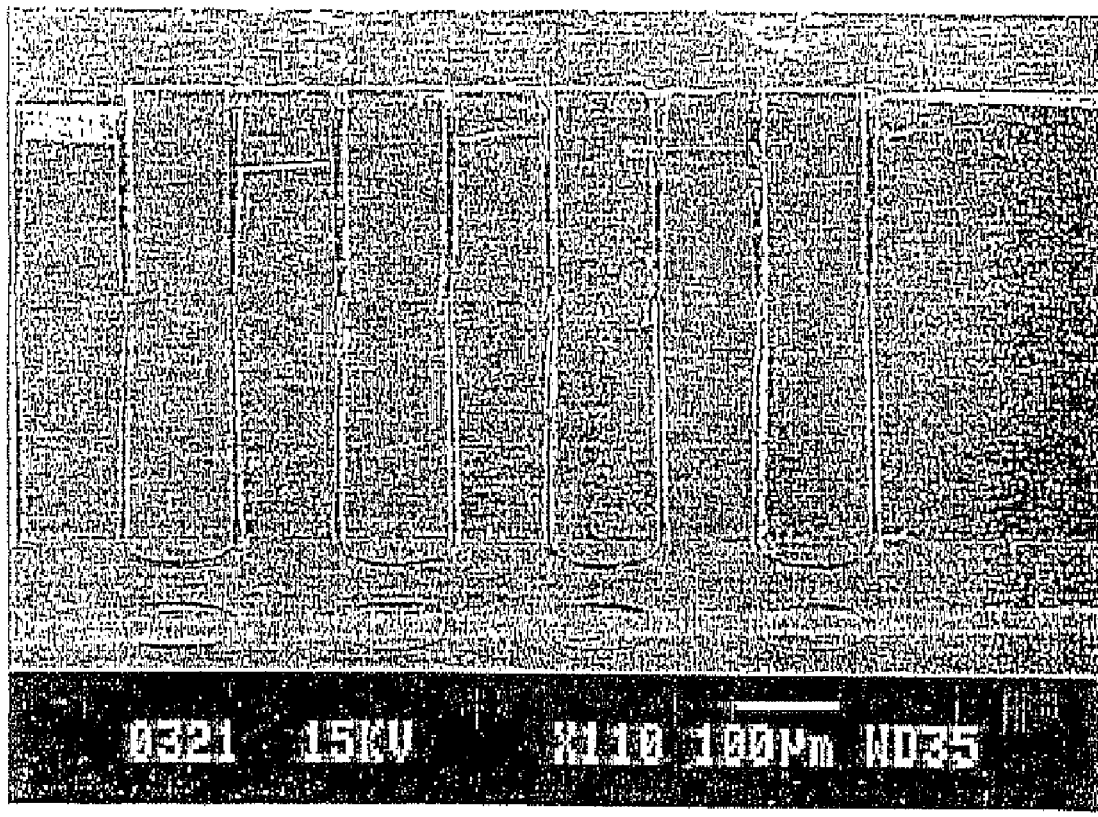
FIG. 11 shows a circular via made by a double etch according to an embodiment of the invention.

FIG. 11 shows an array of vias made according to the embodiment where etching from both sides of the wafer has been employed.

Example 6

Figure 12:
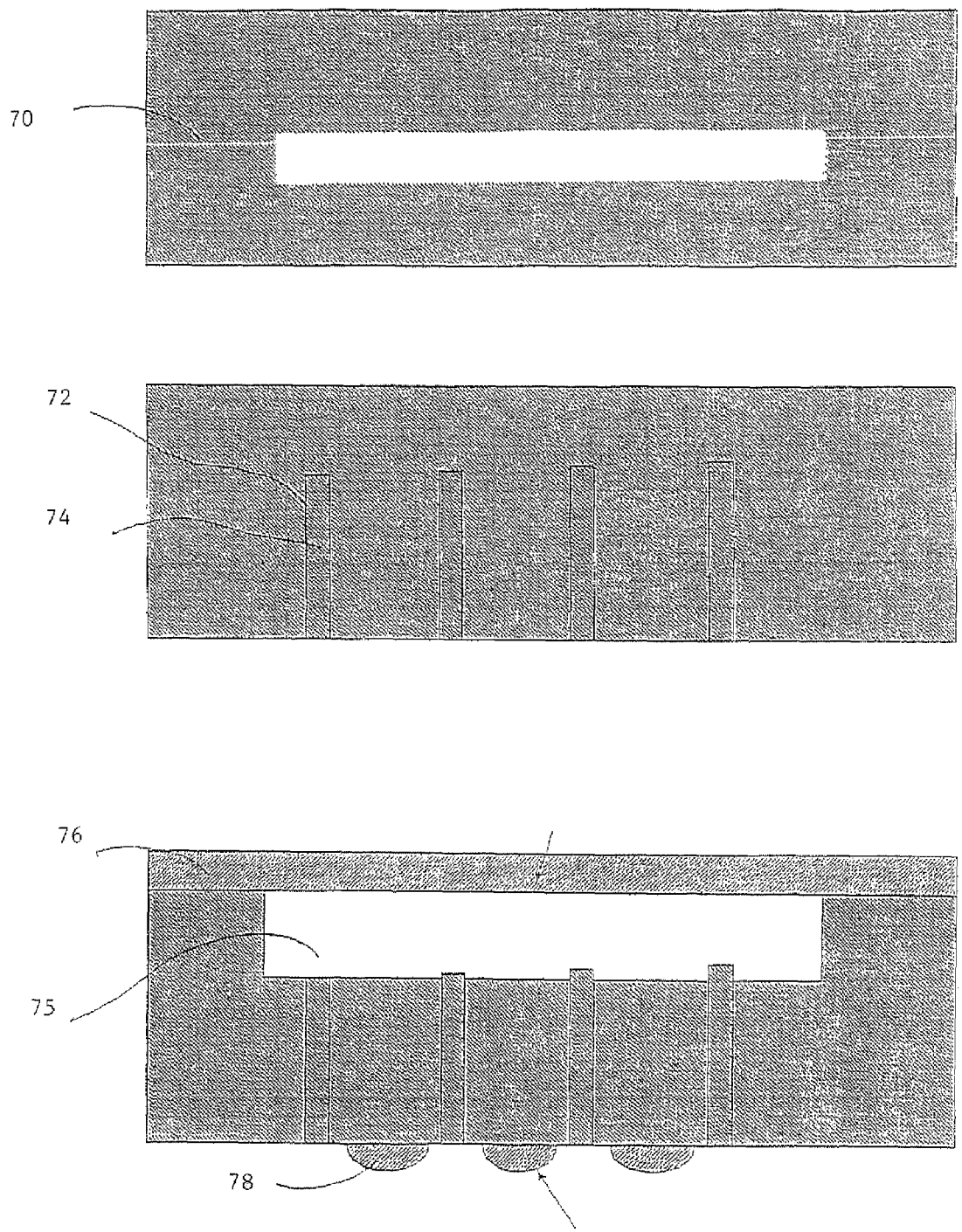
FIG. 12 illustrates schematically a process sequence for making a MEMS device having through connections ending in a cavity.

In FIG. 12 there is shown a schematic process sequence for making a MEMS device, in particular an array of deflectable micro mirrors.

The starting substrate is an ordinary silicon wafer 70, FIG. 12a. Trenches 72 are etched to a certain depth, as described above, and filled with oxide 74, see FIG. 12b. Then, a local area on the opposite side of the wafer (with respect to the trenches) is etched to provide a depression 75 (or cavity), reaching down to where the trenches end, whereby the insulated (preferably circular cylindrical through connections) are exposed, see FIG. 12c. A membrane or an array of micromirrors, or some other suitable element or member (schematically indicated with reference numeral 76 in FIG. 12c), as desired, is provided over the cavity, and the electrical through connections can be used for actuating e.g. a deflectable membrane/mirror by applying a suitable voltage. This can suitably be achieved by providing solder bumps 78 for flip-chip mounting or metal pads for wire bonding, to provide connection to some power source or other energizing device. Technology for manufacturing SLM's (Spatial Light Modulators) whereby the present invention can be used, is disclosed in our pending U.S. patent application Ser. No. 10/654,007.

Example 7

Figure 13:
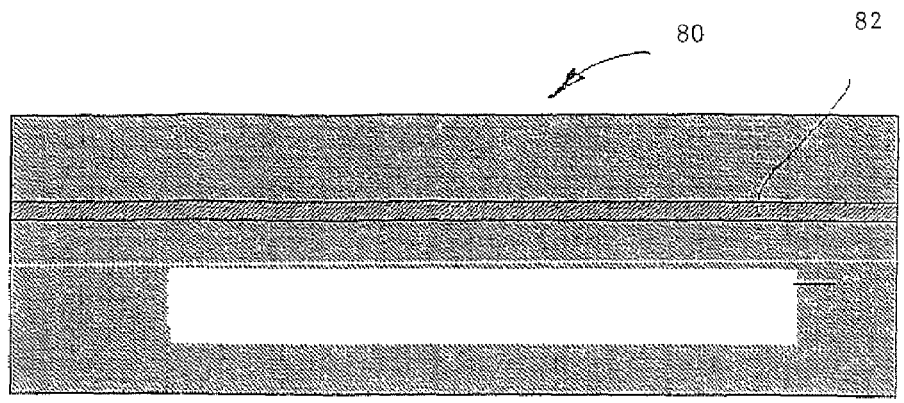
FIG. 13 illustrate a similar process to the one of FIG. 12, but wherein the starting material is an SOI wafer.
Figure 13:
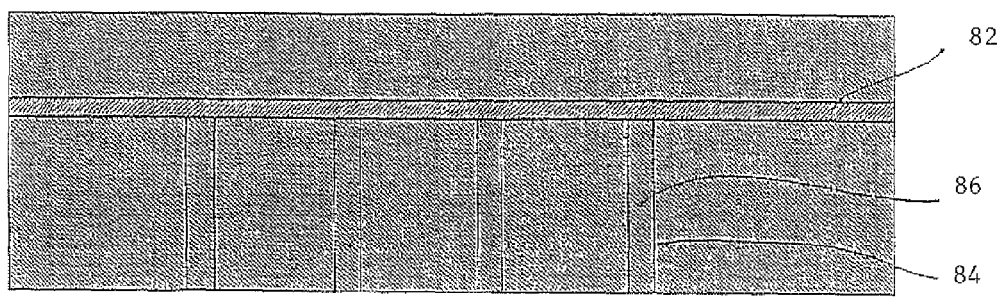
Figure 13:
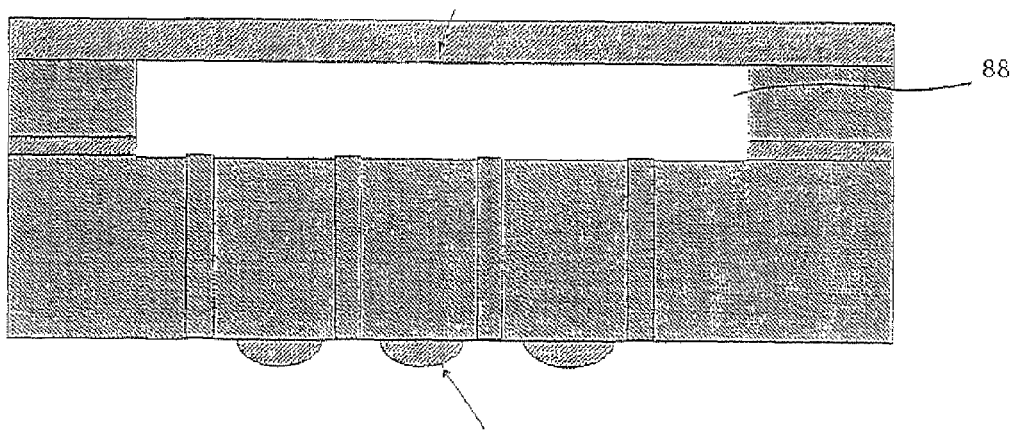

In FIG. 13 a further embodiment of a process sequence for making a MEMS device is schematically illustrated.

Thereby the starting material is a SOI wafer (Silicon On Insulator) 80, wherein an oxide layer 82 is buried inside a silicon wafer, FIG. 13a. Trenches 84 are etched and filled with oxide 86, as described above, but due to the presence of the oxide layer, the trenches will only reach exactly down to the oxide layer, which acts as an etch stop, FIG. 13b. This is an advantage over the embodiment of FIG. 12, wherein the bottoms of each trench may be located at slightly different depths, such that when a depression is etched from the opposite side of the wafer, the through connections may extend slightly above the bottom surface of the depression. This is schematically illustrated in FIG. 12c, wherein it can be seen that there is a slight variation in how much each trench protrudes above the cavity bottom.

On the contrary, in the embodiment of FIG. 13, when the depression 88 is made by etching, first the buried oxide layer 82 will be reached, and then, when the oxide layer is removed, the trenches will be located exactly at the same level inside the depression, see FIG. 13c, or essentially "flush" with the bottom surface of said depressions. In fact, the trenches can be "over etched" to ensure that all the trenches reach the same depth.

Thus, by the disclosure and examples given above, it has been shown that with the present invention, there is provided a product in the form of a starting substrate, in the form of a conducting or semi-conducting wafer, that can be used for the purposes of manufacturing a large variety of semi-conductor devices. By virtue of the wafer already from the start comprising electrical connections extending through the wafer (vias), it will become possible to design and make structures on both sides of the wafer in a very versatile way. The fact that the vias are made form the original wafer itself, makes the wafer capable of withstanding all process conditions usable with plain silicon wafers.

The invention claimed is:

1. A product (10) configured as a starting substrate for a manufacture of micro-electronic and/or micro-mechanic devices, comprising:
    wafer (10) of a semi-conducting or conducting material, and having a first (14) and a second (16) surface, the wafer comprising one or more local depressions (75) in at least one surface thereof;
    at least one electrically conducting member (12) extending through said wafer, wherein
    the electrically conducting member (12) is insulated from surrounding material of the wafer by a finite layer (15) of an insulating material; and
    the electronically conducting member (12) comprises a same material as the wafer, i.e. it is made from the wafer material, and
    the at least one electrically conductive member is essentially flush with a bottom surface of said one or more depressions.

2. The product as claimed in claim 1, wherein said wafer is a semiconductor wafer.

3. The product as claimed in claim 2, wherein said wafer is a silicon wafer.

4. The product as claimed in claim 1, wherein said wafer has a thickness of 200-5000 μm.

5. The product as claimed in claim 1, wherein a thickness of the finite layers of insulating material is 1-20 μm.

6. The product as claimed in claim 1, wherein a pitch/center-to-center distance between the electronically conducting members is larger than 10 μm.

7. The product as claimed in claim 1, wherein the wafer is essentially flat.

8. A Micro-Electrical-Mechanical System (MEMS) device, comprising:
- solder bumps for flip-chip mounting placed on a backside of the device, and having wafer through electrical interconnections (vias, 12), wherein the electrical interconnections (12) are insulated from surrounding material of the wafer by a finite layer (15) of an insulating material, wherein a material of the interconnections comprise a same material as the wafer, i.e. it is made from the wafer material.

9. The product as claimed in claim 1, wherein said wafer has a thickness of 300-3000 µm.

10. The product as claimed in claim 1, wherein said wafer has a thickness of 400-1000 µm.

11. The product as claimed in claim 1, wherein a thickness of the finite layers of insulating material is 8-12 µm.

12. The product as claimed in claim 1, wherein a pitch/center-to-center distance between the electronically conducting members is 50-100 µm.

13. The product as claimed in claim 1, wherein the insulating material is an oxide.

14. The product as claimed in claim 1, wherein the insulating material is TEOS.

15. The product as claimed in claim 1, wherein the wafer is provided with a cavity reaching down to exposed ends of the electrically conducting members.

16. The product as claimed in claim 1, wherein the wafer is provided with a cavity reaching down to exposed ends of the electrically conducting members, and a deflectable membrane is provided over the cavity.

17. The product as claimed in claim 16, wherein the membrane is configured to be actuated by a voltage applied to the electrically conducting members.

18. The product as claimed in claim 1, wherein the wafer is provided with a cavity reaching down to exposed ends of the electrically conducting members, and a deflectable array of micro mirrors is provided over the cavity.

19. The product as claimed in claim 18, wherein the array of micro mirrors are configured to be actuated by a voltage applied to the electrically conducting members.

20. The device as claimed in claim 8, wherein the wafer has one or more local depressions in at least one surface thereof, and the electrical interconnections are essentially flush with a bottom surface of said one or more depressions.

* * * * *